US005614736A

United States Patent [19]

Neumann et al.

[11] Patent Number: 5,614,736
[45] Date of Patent: Mar. 25, 1997

[54] GALLIUM PHOSPHATE LIGHT EMITTING DIODE WITH ZINC-DOPED CONTACT

[75] Inventors: Gerald Neumann, Regensburg; Ernst Nirschl, Wenzëbach; Werner Spaeth, Holzkirchen, all of Germany

[73] Assignee: Siemens Aktiengesellschaft, Munich, Germany

[21] Appl. No.: 533,053

[22] Filed: Sep. 25, 1995

Related U.S. Application Data

[63] Continuation of Ser. No. 232,456, Apr. 22, 1994, abandoned, which is a continuation of Ser. No. 114,323, Aug. 30, 1993, abandoned.

[30] Foreign Application Priority Data

Aug. 28, 1992 [DE] Germany ............................ 42 28 758.8

[51] Int. Cl.⁶ .......................... H01L 33/00; H01L 23/48; H01L 29/46
[52] U.S. Cl. ............................ 257/102; 257/99; 257/103; 257/607; 257/613; 257/745; 257/751; 257/763; 257/764
[58] Field of Search ............................ 257/99, 102, 103, 257/607, 613, 745, 751, 763, 764

[56] References Cited

U.S. PATENT DOCUMENTS

| | | | |
|---|---|---|---|
| 4,101,920 | 7/1978 | Nagusawa et al. | 257/87 |
| 4,224,632 | 9/1980 | Iwamoto et al. | 257/101 |
| 4,228,455 | 10/1980 | Yasuda et al. | |
| 4,259,679 | 3/1981 | Knibb et al. | 257/98 |
| 4,447,825 | 5/1984 | Dana et al. | 257/743 |
| 4,562,378 | 12/1985 | Takenobu et al. | 257/103 |
| 4,582,952 | 4/1986 | McNeely et al. | |
| 4,680,602 | 7/1987 | Watanabe et al. | |
| 4,965,644 | 10/1990 | Kawabata et al. | 257/88 |
| 5,164,798 | 11/1992 | Huang | 257/97 |

FOREIGN PATENT DOCUMENTS

| | | |
|---|---|---|
| 0102734 | 3/1984 | European Pat. Off. . |
| 54-69979 | 6/1979 | Japan . |
| 54-69975 | 6/1979 | Japan . |
| 55-71080 | 5/1980 | Japan . |

OTHER PUBLICATIONS

Patent Abstracts of Japan, vol. 4, No. 112 (E–21) 12. Aug. 1980 for JP–A–55 071 080.
Patent Abstracts of Japan, vol. 3, No. 92 (E–128) 4. Aug. 1979 for JP–A–54 069 975.
Patent Abstracts of Japan, vol. 3, No. 92 (E–128) 4. Aug. 1979 for JP–A–54 069 979.

*Primary Examiner*—Ngân V. Ngô
*Attorney, Agent, or Firm*—Hill, Steadman & Simpson

[57] ABSTRACT

A light emitting diode includes a doped semiconductor substrate wafer with a layer sequence suitable for light emission in the green spectral range epitaxially applied thereon. A zinc-doped contact is applied to the p-conductive side of the wafer for efficient generation of pure green light emissions. An electrically conductive layer is provided between the zinc-doped contact and the p-conductive wafer side to suppress diffusion of oxygen into the p-conductive wafer side during diode manufacture.

5 Claims, 1 Drawing Sheet

GALLIUM PHOSPHATE LIGHT EMITTING DIODE WITH ZINC-DOPED CONTACT

This is a continuation of application Ser. No. 08/232,456 filed Apr. 22, 1994, now abandoned, which is a continuation of application Ser. No. 08/114,323, filed Aug. 30, 1993, now abandoned.

BACKGROUND OF THE INVENTION

1. Field of the Invention

The present invention is directed generally to a light emitting diode and, in particular, to a light emitting diode for emitting light in the green spectral range.

2. Description of the Related Art

Luminous diodes, or light emitting diodes (also referred to as LEDs) are semiconductor diodes which exhibit a luminescence characteristic, in other words, emitting light in the visible spectral range when current flows in the conducting direction.

It is know that gallium phosphide (GaP) semiconductor substrates are used for the manufacture of light emitting diodes having a purely green luminescence. The layer sequence for generating the light active pn-junction is produced by vapor phase epitaxy or liquid phase epitaxy. The use of liquid phase epitaxy provides a light emitting diode of a higher efficiency.

The known green emitting LEDs are composed of GaP epitaxy wafers which are manufactured with such purity and doping that they emit light in the desired, green spectral range on the wafer level. To manufacture what are referred to as pure-green emitting diodes (wherein the dominant wavelength is approximately 557±4 nm) nitrogen inclusion is foregone in the epitaxy method even though a lower efficiency for the LED is a result thereof. The p-doped wafer side of the LED is provided with a partial contact of gold beryllium as one of the two diode contacts in a prescribed surface region. However, beryllium is carcinogenic and extremely toxic. As an accumulatable toxin, it can have a fatal effect due to skin, mucous membrane, and lung disorders.

It is known to provide gold-zinc contacts in green emitting light emitting diodes as the contact for the p-conductive wafers side instead of the gold-beryllium contact. However, this results in an undesired red emission for diodes having such contacts.

SUMMARY OF THE INVENTION

An object of the present invention is to overcome the foregoing disadvantages in light emitting diodes and to provide a light emitting diode which emits pure green light and has a high efficiency, or yield.

This and other objects and advantages of the present invention are achieved in a light emitting diode having a doped semiconductor substrate onto which a layer sequence suitable for light emission in the green spectral range is epitaxially applied. A zinc-doped contact is provided over a part of the p-conductive wafer side and an electrically conductive layer is provided between the zinc-doped contact and the p-conductive wafer side, the electrically conductive layer suppressing diffusion of oxygen into the p-conductive wafer side during manufacture of the diode.

Additional developments and improvements of the invention are provided when the electrically conductive layer is of either gold or titanium. The electrically conductive layer is of such thickness dimension that the zinc from the zinc-doped contact penetrates the electrically conductive layer during the manufacture of the diode and generates a high surface doping in the p-conductive wafer side.

Preferably, the zinc-doped contact is a gold-zinc layer. In one embodiment, the zinc-gold layer is provided with an additional aluminum layer and a further titanium-tungsten nitride layer is provided between the aluminum layer and the zinc-gold layer.

The p-conductive wafer side of the diode may either be formed of a p-conductive epitaxial layer or by a p-conductive semiconductor substrate. The semiconductor substrate of an exemplary embodiment is of gallium phosphide. Furthermore, the p-conductive wafer side of the diode is preferably doped with zinc.

The present invention is based on the perception that oxygen from the residual gas in the sputtering system is bonded by zinc and is incorporated into the gold-zinc (AuZn) layer during the application of the gold-zinc layer in a sputtering process. In the following temperature steps, this oxygen diffuses to the pn-junction and forms neighboring complexes with the dopant used for the p-doping. These neighboring complexes produce an undesirable emission in the red spectral range.

The advantages achieved by the present invention include the prevention of the oxygen from diffusing into the semiconductor upon the application of the contacts or during the following temperature treatment, for example, due to the application of an electrically conductive layer onto the gold-zinc layer during manufacture of the diode. Advantageously, layers of titanium or gold have proven beneficial for such electrically conductive layers. The thickness of these layers is expediently matched such that the zinc from the gold-zinc layer is in the position at the same time to penetrate these layers during the temperature steps so that a high surface doping is produced in the adjoining semiconductor surface and, thus, a good ohmic contact is formed.

The red emission which in the prior art is caused by changes which occur during the chip processing and leads to a shift of the dominant wavelength of the emission by approximately 10 nm from the desired, pure green, dominant wavelength of approximately 557±4 nm, no longer occurs the light emitting diodes of the present invention. As a user friendly concept of the LED spectrum, the dominant wavelength thereby describes the chrominance of an LED as perceived by the human eye.

An increase in the light yield is also achieved by the light emitting diode of the invention, the increased efficiency is a result of more current being available for the excitation of the green light range where the sensitivity of the eye is greater, and without the red transitions.

BRIEF DESCRIPTION OF THE DRAWINGS

The present invention shall be set forth in greater detail below with reference to exemplary embodiments shown in the drawings.

DETAILED DESCRIPTION OF THE PREFERRED EMBODIMENTS

Figure 1:
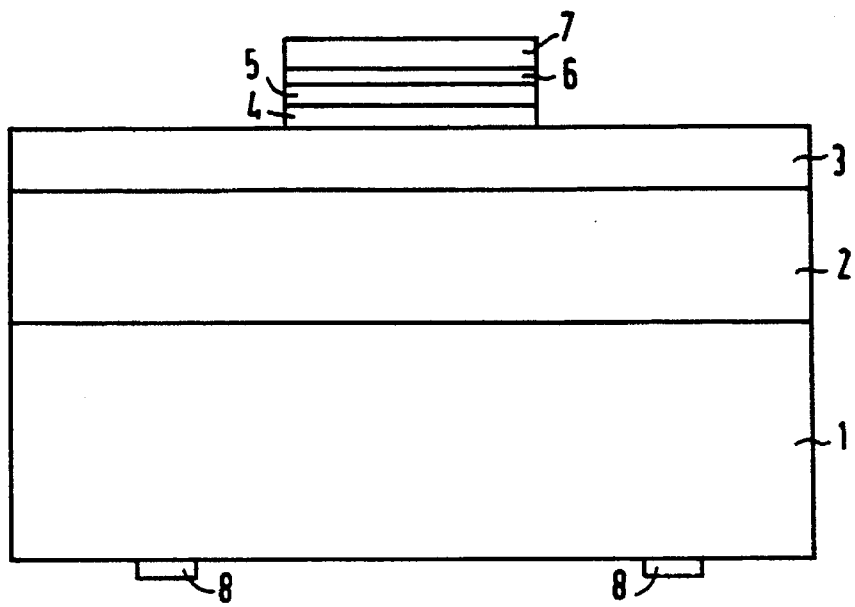
FIG. 1 is a vertical cross section through a light emitting diode according to the principles of the present invention.

In FIG. 1 is shown a light emitting diode on a chip of, preferably, gallium phosphide (GAP) semi-conductive material. The wafer chip, or substrate, is made n-conductive. For example, the gallium phosphide substrate is doped with tellurium (Te) or sulfur (S). An n-conductive layer 2 is epitaxially applied over the substrate 1 and is also doped with tellurium or sulfur. The epitaxial application of the n-conductive layer 2 may be carried out either by vapor phase epitaxy or by liquid phase epitaxy. Over the first epitaxial layer 2 is applied a p-conductive, preferably zinc-doped, layer 3 which is likewise epitaxially applied. This p-conductive layer forms what is referred to as a p-conductive wafer side of the so-called epi-wafer of the light emitting diode.

The epi-wafer is provided with a zinc-doped contact 5 in a predetermined subregion on the surface of the p-conductive wafer side 3. However, an electrically conductive layer 4 is provided between the zinc-doped contact 5 and the p-conductive wafer side 3 to prevent diffusion of oxygen into the p-conductive wafer side 3 during the manufacture of the diode. The intervening electrically conductive layer 4 is preferably of gold or titanium and prevents the oxygen diffusion which may otherwise occur during the application of the contacts or during subsequent temperature treatments. The thickness of the electrically conductive layer 4 is such that zinc from the zinc-doped contact 5 penetrates the conductive layer 4 during the production of the diode and produces a high surface doping. In a preferred embodiment, the zinc-doped contact 5 is a layer of gold-zinc. The zinc penetration provides a high surface doping which results in a highly desirable, good ohmic contact.

During a subsequent mounting of the finished light emitting diode, the contacts can be provided with a metal layer 7 of, for example, either gold or aluminum. Aluminum is the preferred material of the contacts since it provides better mountability for the metal layer 7. A diffusion blocking layer 6 of titanium-tungsten nitride is provided between the metal layer 7 and the zinc-gold layer 5 in an exemplary embodiment. The lower, or n-conductive wafer side 1 of the light emitting diode is provided with metalized contacts 8 which are preferably of gold-germanium. Thus, the light emitting diode of FIG. 1 is composed of an n-conductive GaP substrate with an n-conductive wafer side 1, an n-conductive first epitaxial layer 2 and a p-conductive zinc-doped epitaxial layer 3.

Figure 2:
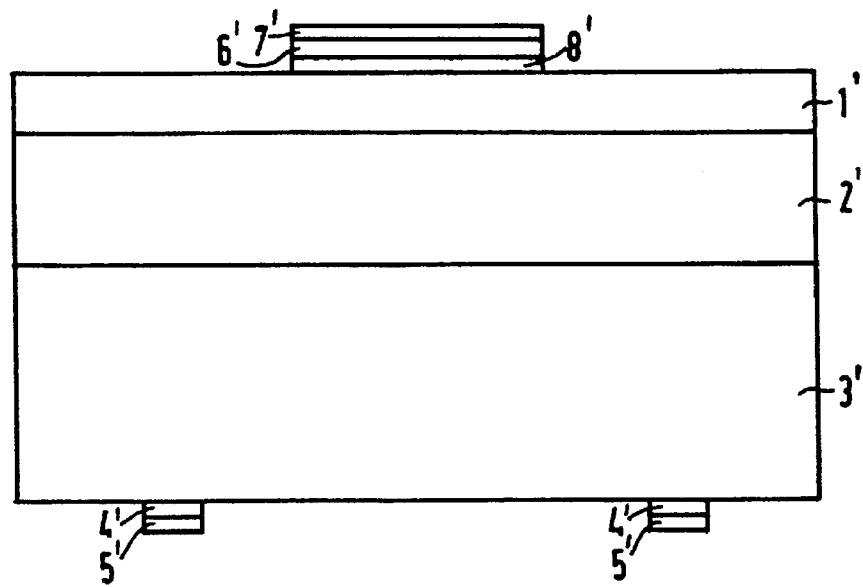
FIG. 2 is a vertical cross section through a second embodiment of the light emitting diode of the invention.

Referring to FIG. 2, a light emitting diode of a second embodiment includes a p-conductive gallium phosphide substrate 3' at a p-conductive wafer side which is preferably zinc-doped. A first epitaxial layer 2' which is p-conductive and is preferably zinc-doped is applied onto the p-conductive substrate wafer 3. An n-conductive layer 1' is epitaxially applied to the p-conductive first epitaxial layer 2'. This second epitaxial layer 1', which preferably has been doped with tellurium or sulfur in an exemplary embodiment forms the n-conductive wafer side when 1' of the diode. The lower side metalized contacts and the zinc-doped contacts which are features of the embodiment shown in FIG. 1 are also present in the embodiment of FIG. 2, although the layer sequence is adapted to the modified layer sequence of the light emitting diode. Thus, a metalization 8' is applied on the n-conductive wafer side 1' but a titanium-tungsten nitrate (TiWN) layer 6' and a metal layer 7' are applied over the metalization 8'. The zinc-doped contact 5' is applied on the p-conductive wafer side 3' with the intervening electrical conductive layer 4' therebetween.

Thus, there is shown and described embodiments of a luminous diode composed of a doped semiconductor substrate wafer onto which a layer sequence suitable for light emission in the green spectral range is epitaxially applied. The p-conductive wafer side is provided with a zinc-doped contact for insuring the generation of pure green light with a high yield and an electrically conductive layer for suppressing diffusion of oxygen into the p-conductive wafer side during manufacture of the diode is provided between the zinc-doped contact and the p-conductive wafer side.

Although other modifications and changes may be suggested by those skilled in the art, it is the intention of the inventors to embody within the patent warranted hereon all changes and modifications as reasonably and properly come within the scope of their contribution to the art.

We claim:

1. A light emitting diode, comprising:

a doped semiconductor substrate wafer having a layer sequence operable for light emission in a pure green spectral range, said doped semiconductor substrate wafer having a p-conductive wafer side and an n-conductive wafer side, said p-conductive wafer side consisting essentially of zinc-doped gallium phosphide;

an electrically conductive layer on said p-conductive wafer side of zinc-doped gallium phosphide that suppresses diffusion of oxygen into said p-conductive wafer side during manufacturing of said light emitting diode, said electrically conductive layer consisting essentially of one of gold and titanium; and a zinc doped contact on said electrically conductive layer, said zinc doped contact is a layer consisting essentially of gold and zinc;

a titanium-tungsten nitride layer on said zinc doped contact, and an aluminum layer on said titanium-tungsten nitride layer.

2. A light emitting diode as claimed in claim 1, further comprising:

a high surface doping of zinc in said p-conductive wafer side of said doped semiconductor substrate wafer resulting from said electrically conductive layer being of a thickness such that zinc from said zinc doped contact has penetrated said electrically conductive layer during manufacture of said light emitting diode.

3. A light emitting diode as claimed in claim 1, wherein said p-conductive wafer side of said doped semiconductor substrate wafer comprises a p-conductive epitaxial layer.

4. A light emitting diode as claimed in claim 1, wherein said p-conductive wafer side of said doped semiconductor substrate wafer comprises a p-conductive semiconductor substrate.

5. A light emitting diode as claimed in claim 1, wherein said p-conductive wafer side is doped with zinc.

\* \* \* \* \*